(12) United States Patent
Wang et al.

(10) Patent No.: US 6,660,975 B2
(45) Date of Patent: Dec. 9, 2003

(54) METHOD FOR PRODUCING FLAT WAFER CHUCKS

(75) Inventors: Albert Wang, Moraga, CA (US); Robert Chen, El Sobrante, CA (US)

(73) Assignee: Matrix Integrated Systems, Inc., Richmond, CA (US)

( * ) Notice: Subject to any disclaimer, the term of this patent is extended or adjusted under 35 U.S.C. 154(b) by 0 days.

(21) Appl. No.: 10/223,226

(22) Filed: Aug. 16, 2002

(65) Prior Publication Data

US 2002/0195440 A1 Dec. 26, 2002

Related U.S. Application Data

(62) Division of application No. 09/749,241, filed on Dec. 27, 2000.
(60) Provisional application No. 60/205,897, filed on May 18, 2000.

(51) Int. Cl.$^7$ ............................. H05B 3/68; H01C 17/00
(52) U.S. Cl. ................................. 219/444.1; 29/610.1
(58) Field of Search .......................... 219/444.1, 465.1, 219/467.1, 468.2, 544, 546, 548; 118/724, 725; 29/610.1, 611, 613, 614, 857, 585, 860; 228/179.1

(56) References Cited

U.S. PATENT DOCUMENTS

| | | |
|---|---|---|
| 2,007,111 A | 7/1935 | Morgan |
| 2,179,934 A | 11/1939 | Jones |
| 3,110,795 A | 11/1963 | Bremer |
| 4,313,783 A | 2/1982 | Davies et al. |
| 4,457,359 A | 7/1984 | Holden |
| 4,458,746 A | 7/1984 | Holden et al. |
| 4,512,391 A | 4/1985 | Harra |
| 4,527,620 A | 7/1985 | Pederson et al. |
| 4,565,601 A | 1/1986 | Kakehi et al. |
| 4,567,938 A | 2/1986 | Turner |
| 4,603,466 A | 8/1986 | Morley |
| 4,724,621 A | 2/1988 | Hobson et al. |
| 5,033,538 A | 7/1991 | Wagner et al. |
| 5,057,673 A | 10/1991 | Farkas et al. |
| 5,090,900 A | 2/1992 | Rudolf et al. |
| 5,096,536 A | 3/1992 | Cathey, Jr. |
| 5,133,284 A | 7/1992 | Thomas et al. |
| 5,155,062 A | 10/1992 | Coleman |
| 5,290,381 A | 3/1994 | Nozawa et al. |
| 5,302,217 A | 4/1994 | Gostic et al. |
| 5,350,479 A | 9/1994 | Collins et al. |
| 5,356,476 A | 10/1994 | Foster et al. |
| 5,382,311 A | 1/1995 | Ishikawa et al. |
| 5,456,757 A | 10/1995 | Aruga et al. |
| 5,462,603 A | 10/1995 | Murakami |
| 5,522,131 A | 6/1996 | Steger |
| 5,837,555 A | 11/1998 | Kaltenbrunner et al. |
| 5,904,872 A | 5/1999 | Arami et al. |
| 6,043,468 A | 3/2000 | Toya et al. |
| 6,147,334 A | 11/2000 | Hannigan |
| 6,150,636 A | 11/2000 | Bogdanski et al. |
| 6,180,931 B1 | 1/2001 | Futakuchiya et al. |

FOREIGN PATENT DOCUMENTS

| | | |
|---|---|---|
| DE | 197 01 640 A1 | 7/1998 |
| WO | WO 93/26038 | 12/1993 |

*Primary Examiner*—Sang Paik
(74) *Attorney, Agent, or Firm*—Knobbe, Martens, Olson & Bear, LLP (57) ABSTRACT

Methods and structures are provided for extremely flat wafer chucks, allowing close thermal contact uniformly across a semiconductor processing substrate. An upper and a lower section are tightly fit to one another with flat inner surfaces in face-to-face contact. The sections also define at least one groove therebetween. The two sections have asymmetrical thickness, but the groove defined therebetween is correspondingly asymmetrical such that the groove is centered in the assembled chuck. A heater element, such as a resistive heater, is placed within the groove with some clearance prior to assembling the upper and lower sections. After assembly and tightening, the chuck is thermally cycled above the normal operating temperature prior to secondary machining, thus assuring flatness that is maintained during high temperature operation.

10 Claims, 7 Drawing Sheets

METHOD FOR PRODUCING FLAT WAFER CHUCKS

REFERENCE TO RELATED APPLICATION

The present application is a divisional of U.S. patent application Ser. No. 09/749,241, filed Dec. 27, 2000, and claims the priority benefit under 35 U.S.C. §119(e) to provisional application No. 60/205,897, filed May 18, 2000.

FIELD OF THE INVENTION

The field of the invention relates generally to wafer chucks, and more particularly to flat wafer chucks for uniform thermal contact and methods of producing the same.

BACKGROUND OF THE INVENTION

Some semiconductor processes, such as photoresist removal (ashing), require a relatively high wafer temperature to achieve the desired process result. For such thermally driven processes, the wafer temperature uniformity determines the ash rate uniformity across the wafer. Ashers are high throughput machines because ashing is one of the most frequently used processes. Generally, a bulk ashing process takes from 10 to 15 seconds, depending on the photoresist, while the overhead steps, such as wafer transfer, pump-down, wafer heating, process pressure stabilization and venting, take just about as much time or more. For this reason, overhead time is just as crucial as process time to the throughput of the machine. Wafer heating is the only overhead step that not only affects the machine throughput but also affects the process result. Fast and uniform wafer heating improves overall machine throughput and the process.

Non-uniform wafer heating introduces another devastating problem: wafer warping. Heating up wafers too rapidly can cause wafers to warp if the heating is not uniform. Unbalanced thermal stresses in wafers due to rapid and non-uniform heating forces a wafer to adjust its shape to find an equilibrium. It takes a wafer more than 10 seconds to relax back to its original flat shape according to our experience. Wafer warping slows down the machine substantially and is considered to be unacceptable in the semiconductor industry.

Figure 1:
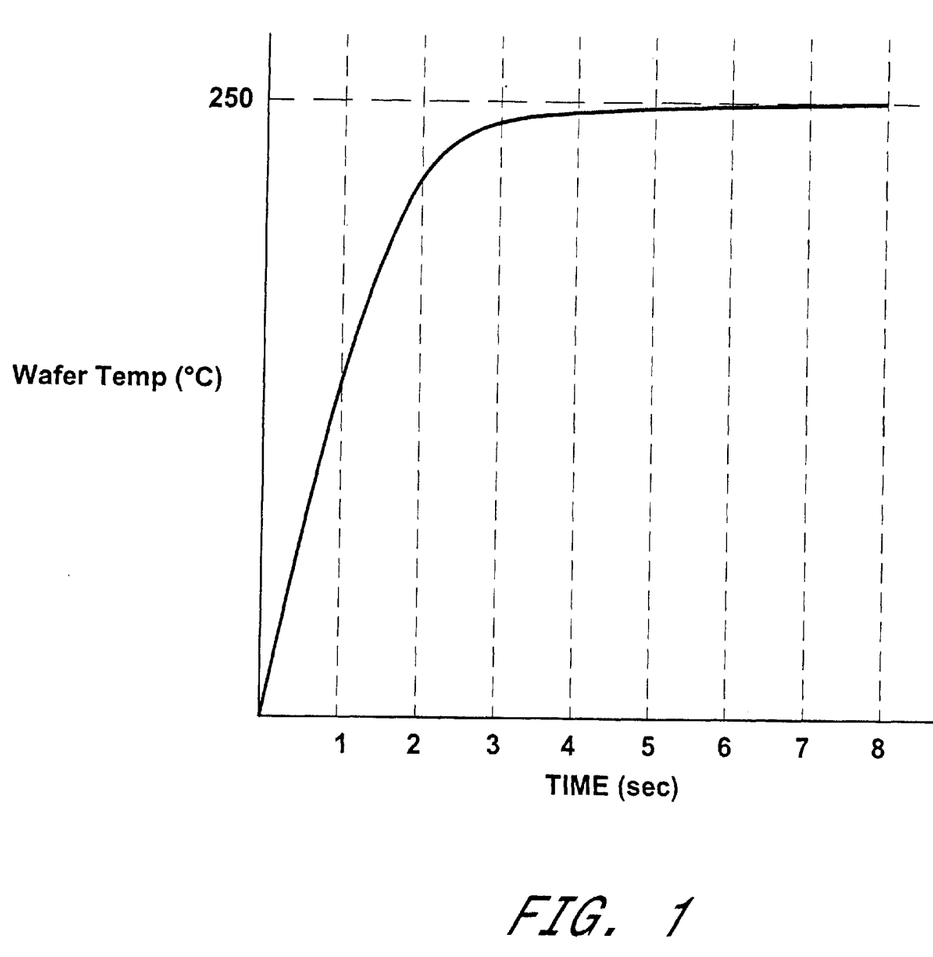
FIG. 1 is graph plotting wafer temperature against time after a cold wafer is dropped onto a heated chuck.

One of the most direct and efficient ways to heat up a wafer is direct contact heating via a heated wafer chuck. For a 250° C. chuck, the high initial heat transfer rate can cause the wafer temperature to rise from room temperature as fast as 100° C./sec. The heat transfer slows down as the wafer temperature asymptotically approaches the chuck temperature, as shown in FIG. 1. It usually takes about four to five seconds for the wafer and the chuck to reach effective equilibrium. Another advantage to using a chuck to heat up a wafer is that it can employ open-loop heating. There is no need to use a wafer temperature sensor in order to know when the wafer has reached the desired temperature. Overheating a wafer (temperature overshoot) is effectively avoided by using a constant temperature chuck.

To obtain a uniform heat transfer and to prevent wafers from warping, the chuck should be very flat at high temperatures and the temperature distribution across the chuck surface should be uniform. If the chuck is not flat enough, non-uniform wafer heating occurs because a better heat transfer occurs at the high spots where wafer contacts the chuck and poorer heat transfer occurs at the low spots. A uniform temperature distribution can be easily achieved by using a high thermal conductivity metal such as aluminum alloys for the chuck material. A flat chuck can be easily machined with high precision CNC tools at room temperature, but that does not ensure its flatness at high temperatures.

Resistive heater elements are commonly used in a heated chuck. A resistively heated chuck can be readily manufactured and machined at room temperature to be extremely flat. When heated up, however, the expansion of the heater elements and the internal stress by machining and assembly can distort the chuck. Machining a metal part at high temperatures, particularly at the chuck's intended working temperature, is difficult because most metals become soft at high temperatures. Aluminum, for example, is practically impossible to machine at 250° C. Most chucks are made of aluminum alloy because of its good thermal conductivity. Using aluminum as the chuck material makes the heater design relatively simple. No special heater pattern is required in order to obtain a uniform temperature distribution on the chuck surface because of aluminum's high thermal conductivity. On the other hand, aluminum alloy also has a high coefficient of thermal expansion, which tends to alter its original shape when heated up. Distortion at high temperature causes the flatness to change and results in non-uniform wafer heating.

There are expensive solutions to achieve uniform wafer heating and to prevent wafer warping. Electrostatic chucks ("e-chucks") and vacuum chucks ("v-chucks") introduce additional forces to clamp down wafers and therefore are able to provide fast and uniform heating without wafer warping. Although these chucks are not new to the semiconductor industry, they are expensive. E-chucks are complicated and are the most expensive chucks to manufacture. And since they require other ancillary parts and systems, the reliability of e-chucks is always in question. Vacuum chucks are also expensive to manufacture due to the need for sealed vacuum channels inside the chuck.

Figure 2:
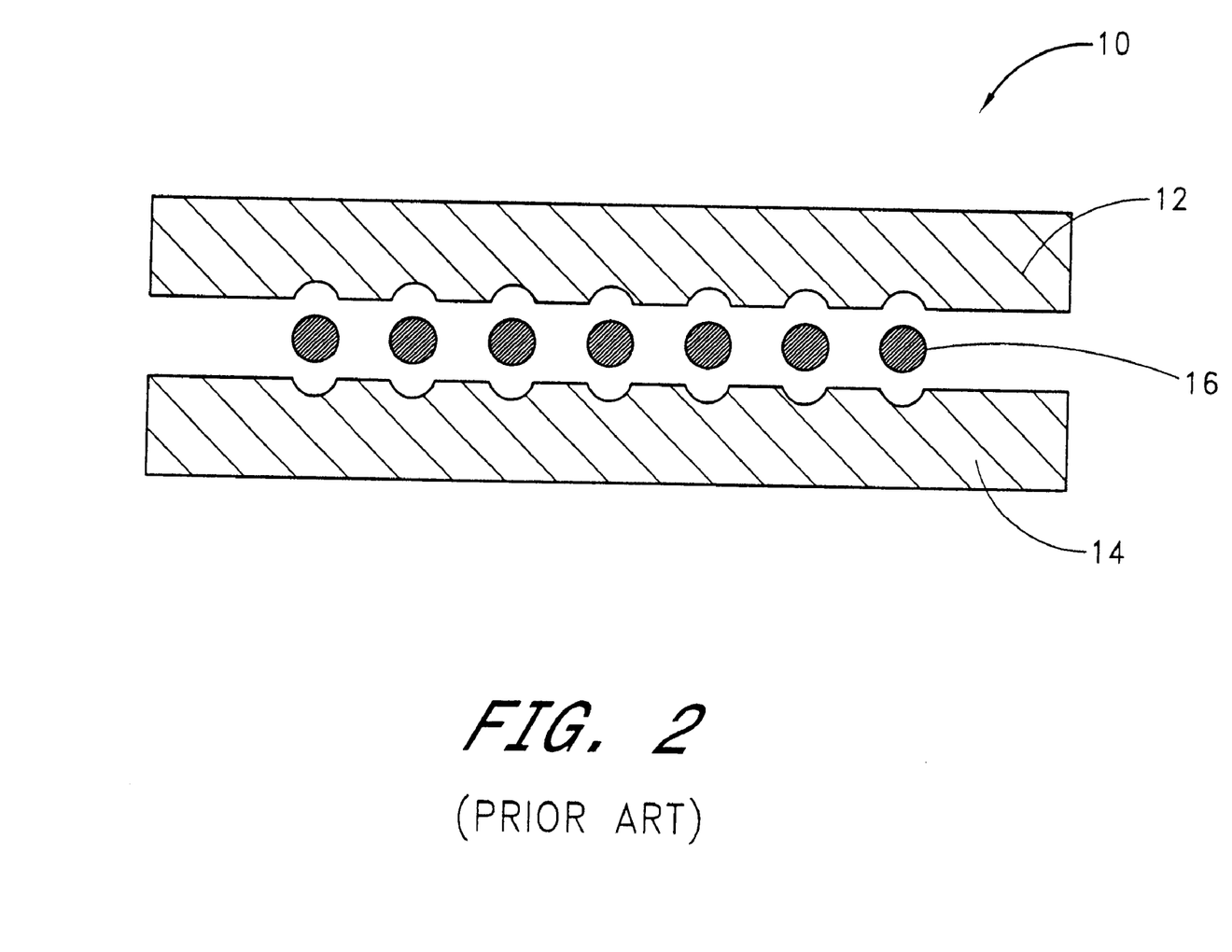
FIG. 2 is a schematic cross section, prior to assembly of a two-piece chuck with intervening heater element(s), constructed in accordance with the prior art.

Metal heater chucks are traditionally made in two ways: mechanical assembly and cast-in. In the case of mechanical assembly, the heater or heaters comprise two clamped and secured metal parts. FIG. 2 shows a cross-section of such a chuck 10, with an upper part 12, a lower part 14 and intervening heater element(s) 16. The least expensive method is to use screws to bolt both metal parts 12, 14 together. Arc welding or brazing is sometimes used alternatively to join the upper and bottom chuck parts 12, 14, but such methods are expensive.

Figure 3:
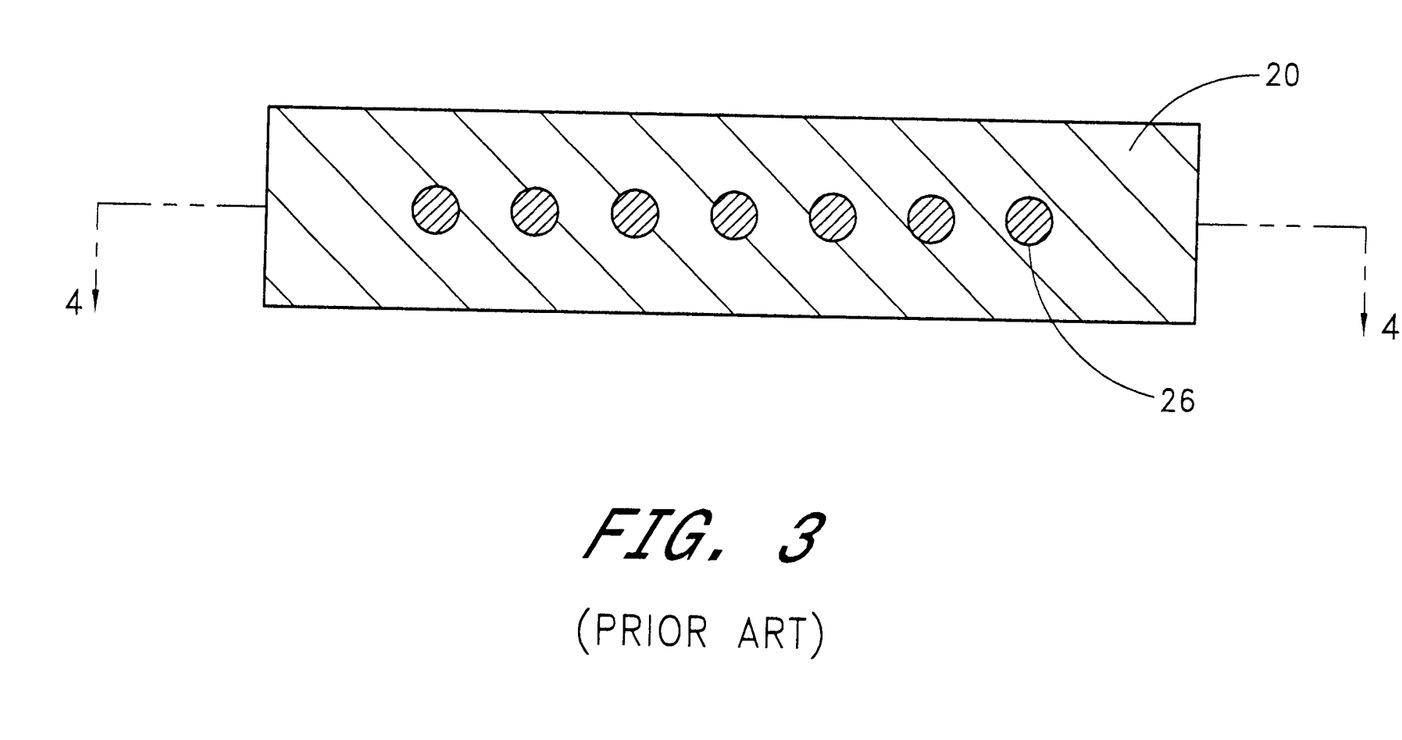
FIG. 3 is a schematic cross section of a one-piece chuck cast around heater element(s), constructed in accordance with the prior art.

In the case of a cast-in chuck 20, as shown in FIG. 3, a die is fabricated and molten aluminum or other metal is then poured into the die in which a heater element or heater elements 26 had already been placed in position. Secondary machining of the wafer-supporting surface after the molten metal is solidified produces the requisite surface finish. Conventional aluminum alloy used for casting chucks is porous and therefore not suitable for use in a vacuum chamber. Special sealing techniques or casting materials are required to avoid the problems associated with porosity. Cast-in chucks are extremely expensive if only a small quantity of chucks is to be produced, due to the tooling cost of the die.

Figure 4:
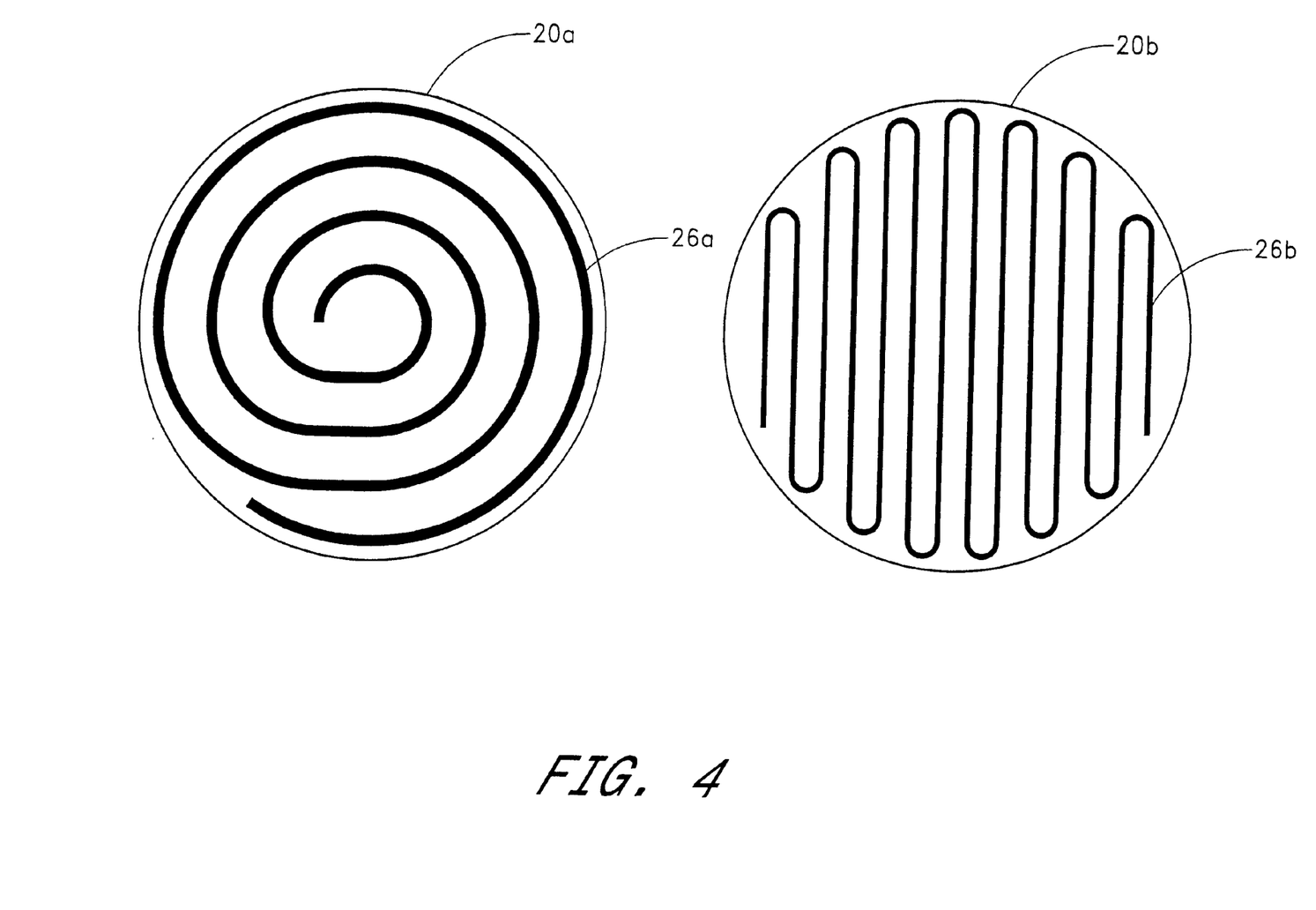
FIG. 4 are schematic cross sections, taken along lines 4—4 of FIG. 3, illustrating two exemplary heater element configurations within the chuck.

Cable and tube heaters are two commonly used resistive heaters for chucks. They are basically resistive heating elements embedded inside a sheath made of stainless steel, Inconel™ or other corrosion-resistant alloys to withstand the aggressive semiconductor processing environment. They can be easily bent to shapes that cover most of the chuck area to provide a uniform temperature distribution. They are widely available and can provide very high heating power at a very low cost. FIG. 4 shows a spiral shaped heater 20a and a serpentine shaped heater 20b as examples, though many other shapes are also possible. While illustrated as cross sections cast-in chucks 20 similar to that of FIG. 3, the skilled artisan will appreciate that such shapes can similarly be fitted into the grooves of the two-piece chuck 10 of FIG. 2.

When using cable or tube heaters, conventional wisdom suggests that a good physical contact between the heater and the chuck is required to heat up the chuck efficiently. Traditionally, the heater grooves of mechanically assembled chucks are designed slightly undersized and the heaters are press-fit in the grooves to obtain good physical contact. Press-fit introduces mechanical stress in the chuck such that the chuck surface is no longer flat after assembly. Secondary machining is often applied after assembly to restore the surface flatness. However, the surface flatness at room temperature does not mean that the chuck stays flat at high temperatures. Firstly, the thermal expansion of different materials (heater, fasteners, and chuck) introduces additional stress in the chuck, changing the chuck flatness. Secondly, the built-in mechanical stress during assembly starts to distort the chuck as the temperature rises.

Figure 5:
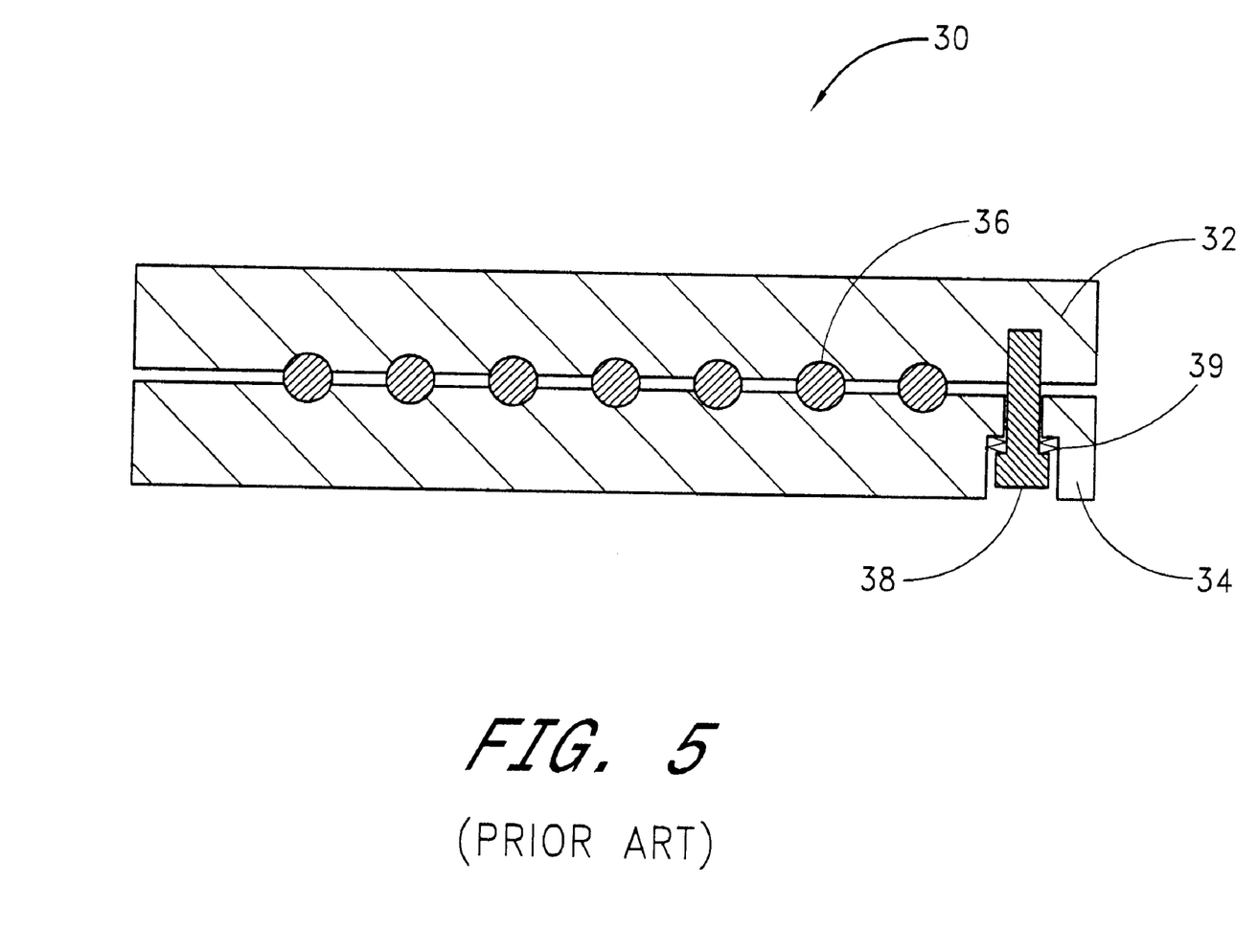
FIG. 5 is a schematic cross section of a two-piece chuck, similar to that of FIG. 2, with the upper and lower parts spaced from one another, in accordance with the prior art.

In order to reduce such stress, a chuck 30 such as shown in FIG. 5 provides a top part 32 and a bottom part 34 on either side of a heater element 36. The top and bottom parts 32 do not contact each other except at screws 38 (one shown). The screws 38 are used with bevel or spring washers 39 to provide a spring force to secure the heaters 36. This design reduces the built-in mechanical stress, as the screws 38 are not fully tightened. One major drawback for this design is that, as the chuck 30 heats up, the temperature gradient from the heater(s) 36 to the chuck surface introduces thermal stress. The temperature is always higher in the area closer to the heater and lower at both the top and bottom surfaces. The thermal stress in the top part 32 and the bottom part 34 do not cancel each other since the top and bottom parts 32, 34 are not firmly secured to one another.

Accordingly, there is a need for improved wafer chucks for semiconductor processing.

SUMMARY OF THE INVENTION

In accordance with one aspect of the invention, a substrate chuck is provided for semiconductor processing. The substrate comprises a first part having a groove therein and a second part configured to tightly fit with the first part and thereby enclose the groove of the first part. A heater element is enclosed within the groove. Preferably, a clearance gap is left between the heater element and the surfaces defining the groove.

In accordance with another aspect of the invention, a method is provided for producing a chuck for supporting a substrate during thermal processing. The method includes assembling two parts with a heater element therebetween. The assembled chuck is thermally treated. Following thermal treatment, a supporting surface of the chuck is machined.

DETAILED DESCRIPTION OF THE PREFERRED EMBODIMENT

A special chuck design and a manufacturing method have been developed that can result in a flatness of no more than about RMS 0.002 inch, more preferably no more than about 0.001 inch, most preferably no more than about RMS 0.0005 inch for operating temperature between 20° C. and 275° C. A 7000 series aluminum alloy was used as the chuck material for its high strength. Other aluminum alloys, such as 6000 series, can be used as well. The illustrated heater element is a ⅛ inch diameter resistance cable heater with Inconel™ sheath, although the skilled artisan will appreciate that heater elements of other types and sizes can be employed (e.g., a tube for circulating hot fluid). In the illustrated embodiments, the heater was bent on a mandrel to have a serpentine shape (see heater 26b in FIG. 4), such that only one groove 57 is provided. More generally, the shape of the heater is selected to provide a uniform temperature distribution on the chuck surface.

Figure 6:
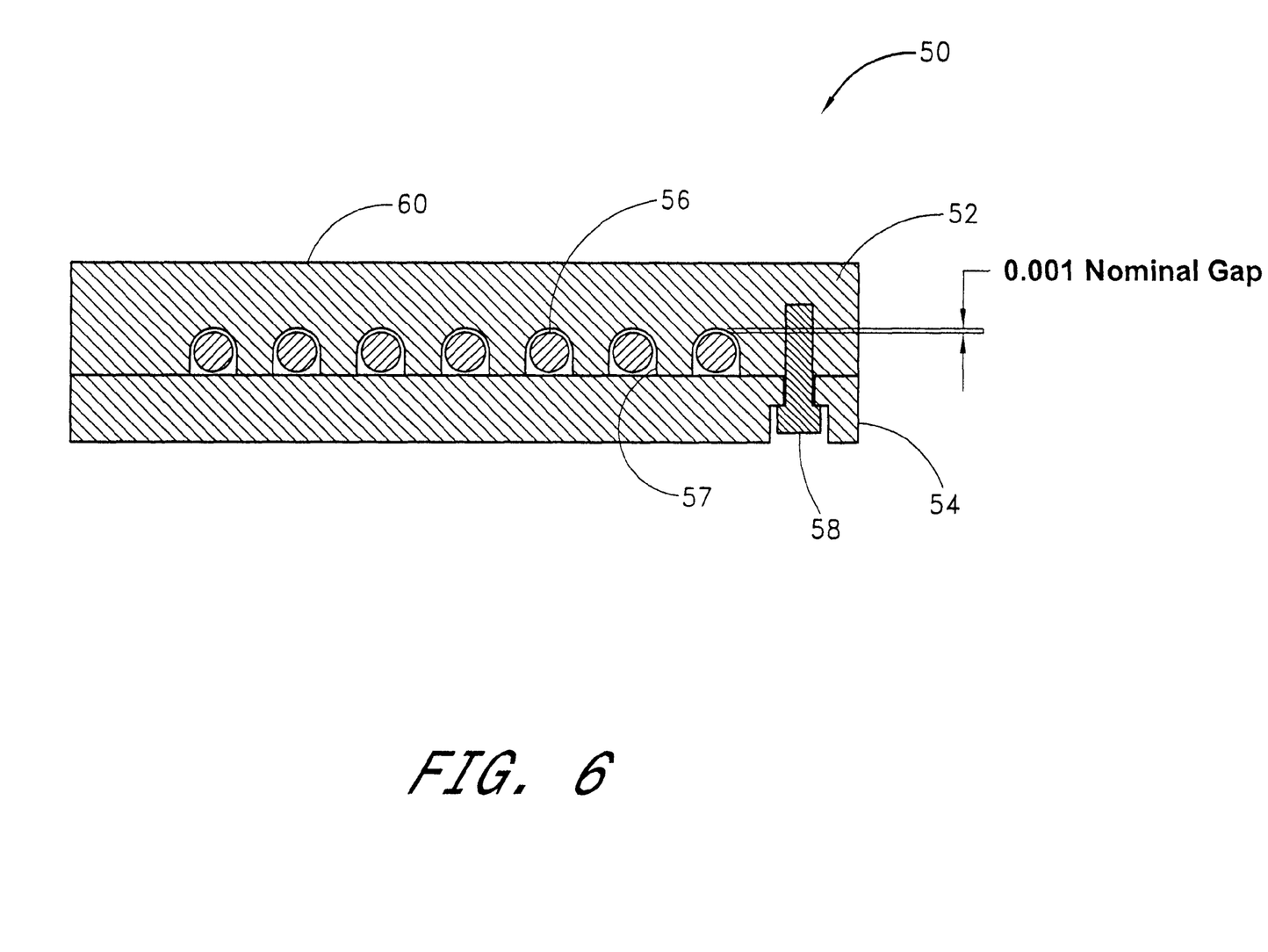
FIG. 6 is schematic cross section of a two-piece chuck, constructed in accordance with a preferred embodiment of the present invention.

As shown in FIG. 6, a chuck 50 in accordance with the preferred embodiments includes three major parts: a top piece 52, a bottom piece 54 and a heater 56. Preferably, only the top piece 52 has heater groove(s) 57. The bottom piece 54 is just a flat plate. In other arrangements, it will be understood that groove(s) can be formed in the lower piece while the upper piece is a flat plate. Thus, only one piece needs to be machined for grooves, reducing manufacturing costs.

The lower surface of the upper piece 52 and the upper surface of the bottom piece 54 are arranged to have close face-to-face contact, in contrast with the chuck 30 of FIG. 5. Twenty-five stainless steel screws 58 (one shown) tightly bolt the top piece 52 and the bottom piece 54 together with the heater 56 sandwiched in the center. The screws 58 are evenly spaced to obtain a uniform bolting force across the chuck 50. The number of screws used depends, of course, on the size of the chuck. In the illustrated embodiment, the screws 58 are spaced about 1 inch to 2 inches apart to obtain a uniform and strong bolting force. The illustrated chuck 50 is 9.4 inch in diameter and 1 inch thick for processing 8-inch (200 mm) wafers. Preferably, both the top and bottom surfaces of each of the top and bottom parts 52, 54 have an initial flatness of no more than 0.0005 inch so that, when bolted together, less mechanical stress is introduced.

The heater grooves 57 are designed so that there is preferably a nominal gap of 0.0001 inch to 0.005 inch, more preferably between about 0.0005 inch and 0.002 inch, and in the illustrated embodiment about 0.001 inch between the chuck 50 and the heater element 56 after assembly. This oversized groove design ensures that the heater 56 does not introduce substantial additional mechanical stress when installed. The lack of good physical contact between the heater 56 and the chuck 50 apparently does not cause any heating problems because, after the chuck is assembled, the heater is fully enclosed by the grooves 57 and the lower part 54. All the heat flux coming out of the heater goes to the chuck. In reality, physical contact between the chuck parts 52, 54 and the heater 56 still exist but without introducing much mechanical stress.

The groove(s) 57 in the top chuck piece 52 and the relative thickness of the top and bottom parts 52, 54 are configured so that, after the chuck 50 is assembled, the heater 56 is at the center of the assembled chuck 50. Thus, the thickness of the top part 52 and bottom part 54 of the illustrated embodiment are selected to be asymmetrical to compensate for the design with grooves in one part only. In the illustrated embodiment, with the groove 57 formed only in the top piece 52, the difference is thickness between the top piece 52 and the bottom piece 54 is substantially equal to the depth of the groove 57 into the lower surface of the top piece 52. The skilled artisan will readily appreciate that, in other arrangements, asymmetrical mating grooves (i.e., one side with deeper grooves than the other) can similarly provide centered heater elements with asymmetrical part thicknesses. In this case, the deeper groove is provided in the thicker part, and the difference in thickness of the parts is about equal to a difference in the depth of the grooves in the two parts This ensures that when heated up, the axial temperature gradient does not introduce any net thermal stress. In still other arrangements, symmetrical mating oversized grooves can be provided for fitting the heater element (s) therein with the desired clearance.

Figure 7:
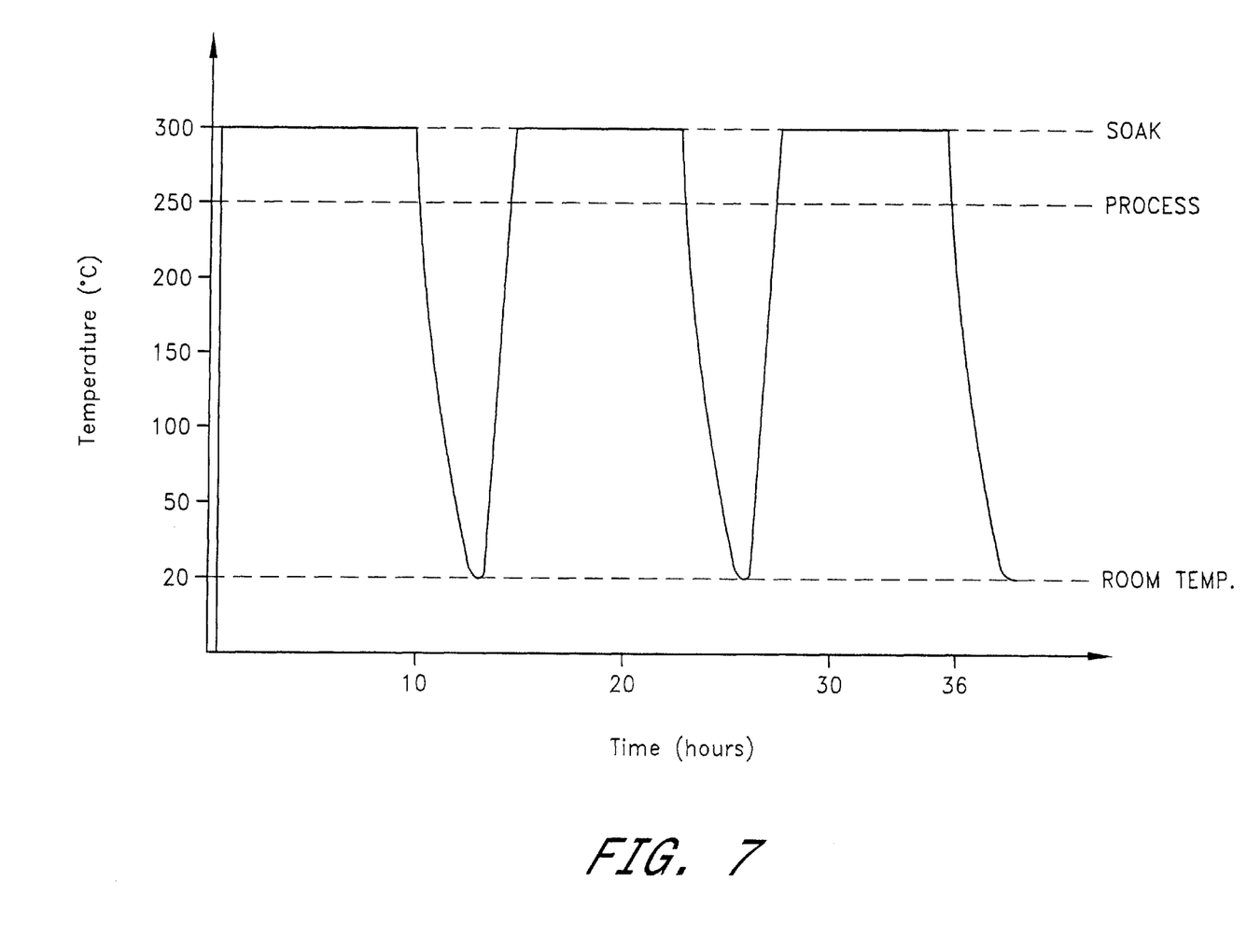
FIG. 7 is a graph plotting temperature against time, illustrating thermal cycling of the chuck of FIG. 6 in accordance with a preferred embodiment of the present invention.

The assembled chuck 50 then preferably goes through a special annealing process to relieve the mechanical stress built-in during assembly. This thermal cycling is partially shown in FIG. 7. The chuck 50 is heated up to a temperature (e.g. 300° C.) higher than the normal operation temperature (e.g. 250° C.) using the embedded heater 56 and held steady for more than 1 hour, more preferably 2–15 hours, and most preferably for 8–12 hours. In the illustrated embodiment, the chuck 50 is "soaked" at the high temperature for a period of about 10 hours. The chuck 50 is then slowly cooled down or "relaxed" over a period of between about 1 hour and 3 hours, more preferably about 2 hours ±15 minutes, to about room temperature in the illustrated embodiment. This heating and cooling cycle is repeated for at least 6 times.

After annealing, the entire chuck 50 becomes stable below the annealing or "soak" temperature (e.g. 300° C.). To obtain the desired flatness at the supporting surface 60 that is to contact the wafer or other substrate during thermal processing, the entire chuck 50 is then machined after the thermal cycling without disassembling the chuck 50. Only the wafer-contacting surface 60 is re-machined, since machining introduces stress in the part. As little material as possible is removed to minimized the introduction of additional stress. This surface 60 is configured to receive and gravitationally support the substrate during processing, preferably during microwave ashing. Thus, the gravitational chuck 50 is preferably not provided with electrical connections for electrostatically attracting the substrate, nor does the preferred supporting surface 60 include gas ports for vacuum clamping. Preferably, the chuck 50 does include openings for lift pins (not shown) to extend therethrough.

With the special design, the annealing process and secondary machining, the supporting surface 60 of the chuck 50 can retain it flatness within 0.0005 inch at temperatures from 20° C. to 300° C.

During processing, the wafer is desirably allowed to partially pre-heat as the wafer slowly descends onto the supporting surface 60. A mechanism for withdrawing lift pins (not shown) through the chuck is one manner of accomplishing such a controlled descent. Wafer curling is thus alleviated.

When the wafer reaches the supporting surface 60 and is supported by gravity, uniform contact with the flat chuck 50 promotes uniform heating and avoids wafer curl.

Although the foregoing invention has been described in terms of certain preferred embodiments, other embodiments will become apparent to those of ordinary skill in the art in view of the disclosure herein. Accordingly, the present invention is not intended to be limited by the recitation of preferred embodiments, but is intended to be defined solely by reference to the appended claims.

We claim:

1. A method of producing a chuck for supporting a substrate during thermal processing, comprising:

providing a chuck with a heater element embedded therein;

thermally treating the chuck by raising a temperature of the chuck to an elevated temperature higher than a normal operation temperature for the chuck, maintaining the chuck at the elevated temperature, and ramping the chuck temperature down to less than about 50° C., wherein the elevated temperature is about 300° C. and the normal operation temperature for the chuck is between about 20° C. and 275° C.; and machining a supporting surface of the chuck after thermally treating.

2. The method of claim 1, wherein maintaining the chuck at the elevated temperature is conducted for more than 1 hour.

3. The method of claim 2, wherein maintaining the chuck at the elevated temperature is conducted for between about 2 hours and 15 hours.

4. The method of claim 2, wherein maintaining the chuck at the elevated temperature is conducted for between about 8 hours and 12 hours.

5. The method of claim 2, wherein ramping the chuck temperature down to less than 50° C. comprises ramping the chuck temperature down to about room temperature.

6. A method of producing a chuck for supporting a substrate during thermal processing, comprising:

providing a chuck with a heater element embedded therein;

thermally treating the chuck by raising a temperature of the chuck to an elevated temperature higher than a normal operation temperature for the chuck, maintaining the chuck at the elevated temperature for more than 1 hour, ramping the chuck temperature down to less than about 50° C., wherein thermally treating comprises repeatedly raising, maintaining and ramping down the temperature of the chuck at least 6 times; and machining a supporting surface of the chuck after thermally treating.

7. The method of claim 6, wherein providing the chuck comprises tightly fitting upper and lower parts of said chuck together to enclose a groove therebetween.

8. The method of claim 7 wherein tightly fitting comprises arranging close face-to-face contact between the upper part and the lower part at portions between legs of the groove, and leaving a clearance gap within the groove between the parts and the heater.

9. The method of claim 8, wherein the clearance gap within the groove is between about 0.0001 inch and 0.005 inch within the groove.

10. The method of claim 9, wherein the clearance gap within the groove is between about 0.0005 inch and 0.002 inch.

\* \* \* \* \*